(12) United States Patent
Friden et al.

(10) Patent No.: US 8,135,549 B2
(45) Date of Patent: Mar. 13, 2012

(54) METHOD AND DEVICE FOR SPECIFIC ABSORPTION RATE MEASUREMENT OF AN ELECTRIC FIELD

(75) Inventors: Jonas Friden, Mölndal (SE); Martin Siegbahn, Johanneshov (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 408 days.

(21) Appl. No.: 12/447,289

(22) PCT Filed: Oct. 27, 2006

(86) PCT No.: PCT/SE2006/050429
§ 371 (c)(1),
(2), (4) Date: Apr. 27, 2009

(87) PCT Pub. No.: WO2008/051125
PCT Pub. Date: May 2, 2008

(65) Prior Publication Data
US 2010/0004881 A1  Jan. 7, 2010

(51) Int. Cl.
*G01R 29/08* (2006.01)
(52) U.S. Cl. .............................. 702/57; 324/642; 455/423
(58) Field of Classification Search .................. 702/57, 702/62, 79, 127, 143, 189; 324/96, 335, 324/354, 600, 629, 637, 642; 455/423
See application file for complete search history.

(56) References Cited

U.S. PATENT DOCUMENTS
5,789,929 A * 8/1998 Hankui .......................... 324/642
2008/0261584 A1* 10/2008 Qi et al. ........................ 455/423

FOREIGN PATENT DOCUMENTS
EP   1615041 A1   1/2006
GB   2308198 A    6/1997

OTHER PUBLICATIONS
Andrew Roczniak et al "3-D Electromagnetic Field Modeling Based on Near Field Measurements." IEEE Instrumentation and Measurement Technology Conference Brussels, Belgium, Jun. 4-6, 1996, p. 1125.

* cited by examiner

*Primary Examiner* — John H Le
(74) *Attorney, Agent, or Firm* — Roger S. Burleigh

(57) ABSTRACT

A method and device for calculating the Specific Absorption Rate (SAR) caused in a body by the electric field of a wireless communications device. The method involves using a model of a body, wherein the device is placed in proximity to the model and the electric field is measured at discrete points, including measuring the magnitude of the electric field at points of a first and a second surface of the model. By means of the measured magnitudes, the phase at said points is determined, such that the complex electric field at said points is determined. The complex electric field at said points is then used to determine the complex electric field in the model of the body. The complex electric field is used in order to calculate the SAR value caused by the device.

12 Claims, 2 Drawing Sheets

METHOD AND DEVICE FOR SPECIFIC ABSORPTION RATE MEASUREMENT OF AN ELECTRIC FIELD

TECHNICAL FIELD

The present invention relates to the measuring of the Specific Absorption Rate (SAR) of the electric field emitted by a wireless communications device.

By means of the invention, such measurements can be performed more rapidly and with greater ease than previously.

BACKGROUND

Dosimetric Specific Absorption Rate (SAR) measurements for, inter alia, mobile phone and radio base station antennas are widely used today.

In the standard procedure used today, a probe is used to scan a volume inside a "phantom", i.e. a model intended to resemble the human body, usually a container filled with a body-tissue equivalent liquid.

The probe is used to register the amplitude of the vector components of the electric field emitted by the device which is to be measured. The antenna or device under test is placed on or near the surface of the phantom. The amplitude of the electric field vector components are measured, and the mass-averaged SAR values are determined, for example by means of a sliding spatial averaging.

Examples of existing solutions for SAR measurements are volumetric scan in the entire volume, sparse volumetric scan with data fitting to a given model, and area scan of SAR and propagation into a volume using attenuation factors from previous experiments.

The existing solutions provide good SAR measurements, but can be said to have drawbacks in that they are relatively time-consuming, and in some cases model dependent, i.e. tailored to a certain device or type of device.

Patent EP 1 615 041 discloses a device for measuring the SAR value of a cellular telephone, but the device of that document measures both the amplitude and the phase of an electric or magnetic field.

U.S. Pat. No. 5,789,929 discloses a method for SAR measurements which involves measuring two orthogonal magnetic fields, and does not appear to disclose anything regarding the use of measured amplitudes of the magnetic or the electric field in order to arrive at the complex electric field.

SUMMARY

As disclosed above, there is thus a need for a method which can be used to carry out SAR measurements more rapidly than present solutions, and which is also independent of the model or kind of device which is to be measured.

This need is addressed by the present invention in that it discloses a method for calculating the Specific Absorption Rate (SAR) in a body of the electric field emitted by a wireless communications device.

The method comprises the use of a model of the body in which the SAR value is to be calculated. The device which is to be measured is placed in the proximity of said model, and the electric field components are measured at specific points in the model.

According to the method of the invention, the measurements of the electric field components are carried out in points of a first and a second surface in the model, and the measurements comprise the magnitude of the electrical field components in said points.

The measured magnitudes are used in order to determine the phase of the electric field components in said points, so that the complex electric field in said points is determined.

Additionally, the complex electric field in said points is used in order to determine the complex electric field over an entire volume of interest in the model, and the complex electric field over said entire volume is used in order to calculate the SAR value caused by the electric field emitted by the device over the volume of interest.

Since the method of the invention can be carried out by means of measurements in two surfaces in the body, as opposed to previously known methods, it will be realized that significant advantages can be gained using the invention with regard to the time that is necessary for obtaining the SAR value.

Additional advantages are obtained since the method of the invention can be used to determine the SAR value using only measurements of the magnitude of the field in the measurement points, as opposed to methods which measure the complex field in the measurements points, i.e. both amplitude and phase.

The term "volume of interest" is used in this text in order illustrate that only parts of the entire volume of the body or model of the body may be of interest when making the measurements in question.

The term "field components" is used in order to signify the fact that the electric field in each measurement point comprises three orthogonal components.

BRIEF DESCRIPTION OF THE DRAWINGS

The invention will be described in more detail in the following, with reference to the appended drawings, in which.

DETAILED DESCRIPTION

Figure 1:
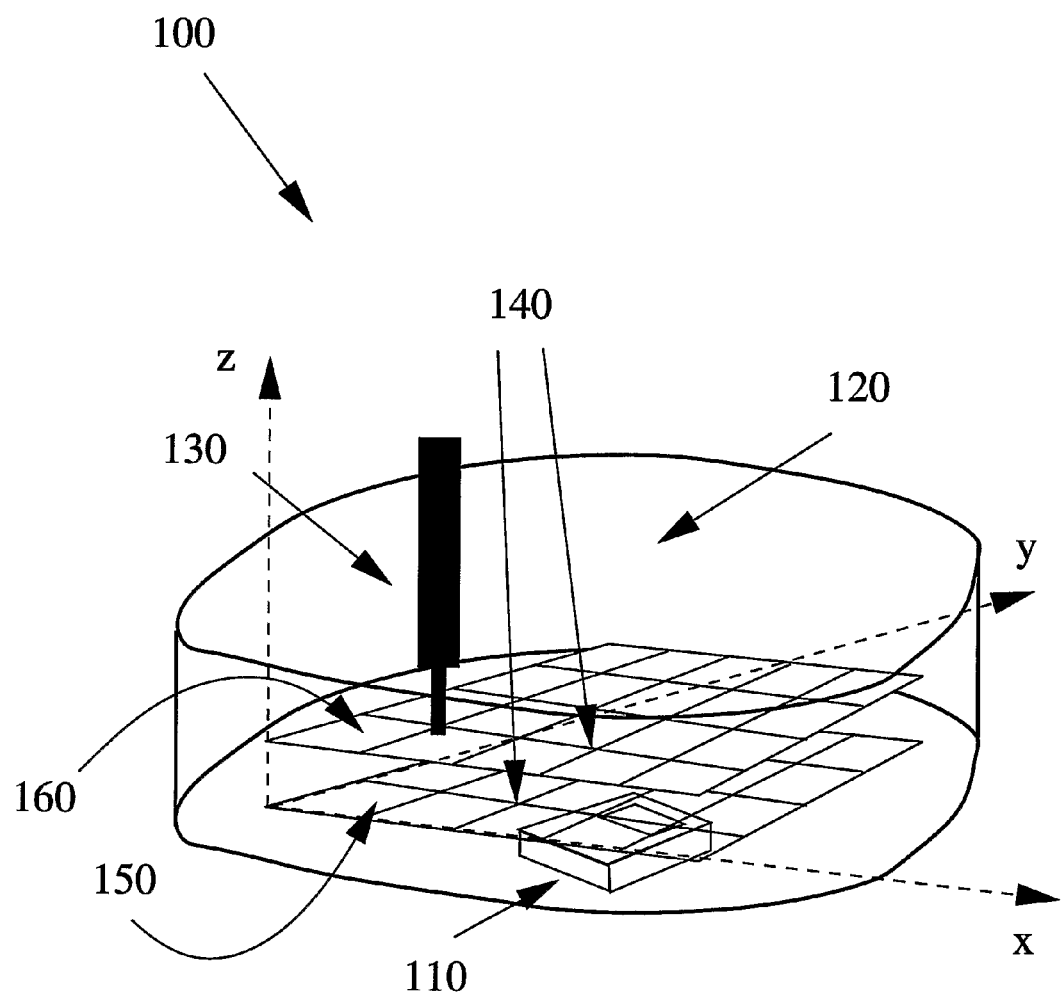
FIG. 1 shows a schematic overview of a measurement set-up according to the invention.

In FIG. 1, a measurement set-up 100 for use with the invention is shown. In the set-up 100, there has been positioned a device 110 which is to be tested for electric emissions. The invention can be used for virtually any device which emits electric radiation, but the invention will be described using a cellular telephone as the device 110. However, examples of other devices to which the invention might be applied are cordless telephones, cordless microphones, auxiliary broadcast devices and radio parts of various sizes intended for computers.

As has been described above, the invention is directed towards measuring the Dosimetric Specific Absorption Rate (SAR) for the device 110. The SAR value which it is desired to determine is usually that in a human body which is in the proximity of the device in the question.

In order to simulate a human body, a so called "phantom" 120 is used, i.e. a model of the human body. The model 120 can be of many kinds, but in the embodiment shown in FIG. 1 a container filled with a liquid which has tissue equivalent electric properties.

In order to measure the electric field caused by the device 110 inside the model 120, a vector field probe 130 is used.

In conventional SAR measurements, the probe 130 would have been moved over points in a volume of the model 120, by means of which the complex electric field in the model 120 would have been determined. This is a method which works well, but which is inherently time-consuming, something which will be particularly bothersome in whole-body SAR measurements.

In the method of the invention, the device 110 to be measured is, in similarity to earlier methods, placed in the proximity of the model 120, and the electric field is measured at specific points in the model 120. However, in the method of the invention, the measurements of the electric field are only carried out in points of a number of surfaces in the model 120.

For reference, a grid 140 has been superimposed on the test set-up in FIG. 1.

In a preferred embodiment, as shown in FIG. 1, the measurements are carried out in a first 150 and a second 160 surface. As shown in FIG. 1, in a preferred embodiment the measurement surfaces are planar, but the surfaces can also be curved, the method of the invention works equally well for both types of surfaces.

As also shown in FIG. 1, the measurement surfaces 150, 160, are parallel to one another in a preferred embodiment, but in other embodiments the surfaces need not be parallel.

It will be realized that since the method of the invention only measures the electric field in two surfaces as opposed to measurements carried out over the entire volume of the model 120, significant benefits are obtained by means of the invention regarding the time needed for the measurements.

In order to further minimize the time needed for the actual measurements, the measurements comprise measuring only the magnitude (amplitude) of the electric field in said points.

The measured amplitudes are then used in order to determine the phase of the electric field in said points, so that the complex electric field in said points is determined. The exact mechanism for doing this will be elaborated upon in more detail in the following. The term "complex electric field" is here used to signify the fact that the electric field comprises both amplitude and phase.

With the aid of the complex electric field in the measurement points, the complex electric field is determined over an entire volume of interest in said model and by means of the complex electric field over the entire volume, the SAR caused by the device 110 over said volume is calculated.

Figure 2:
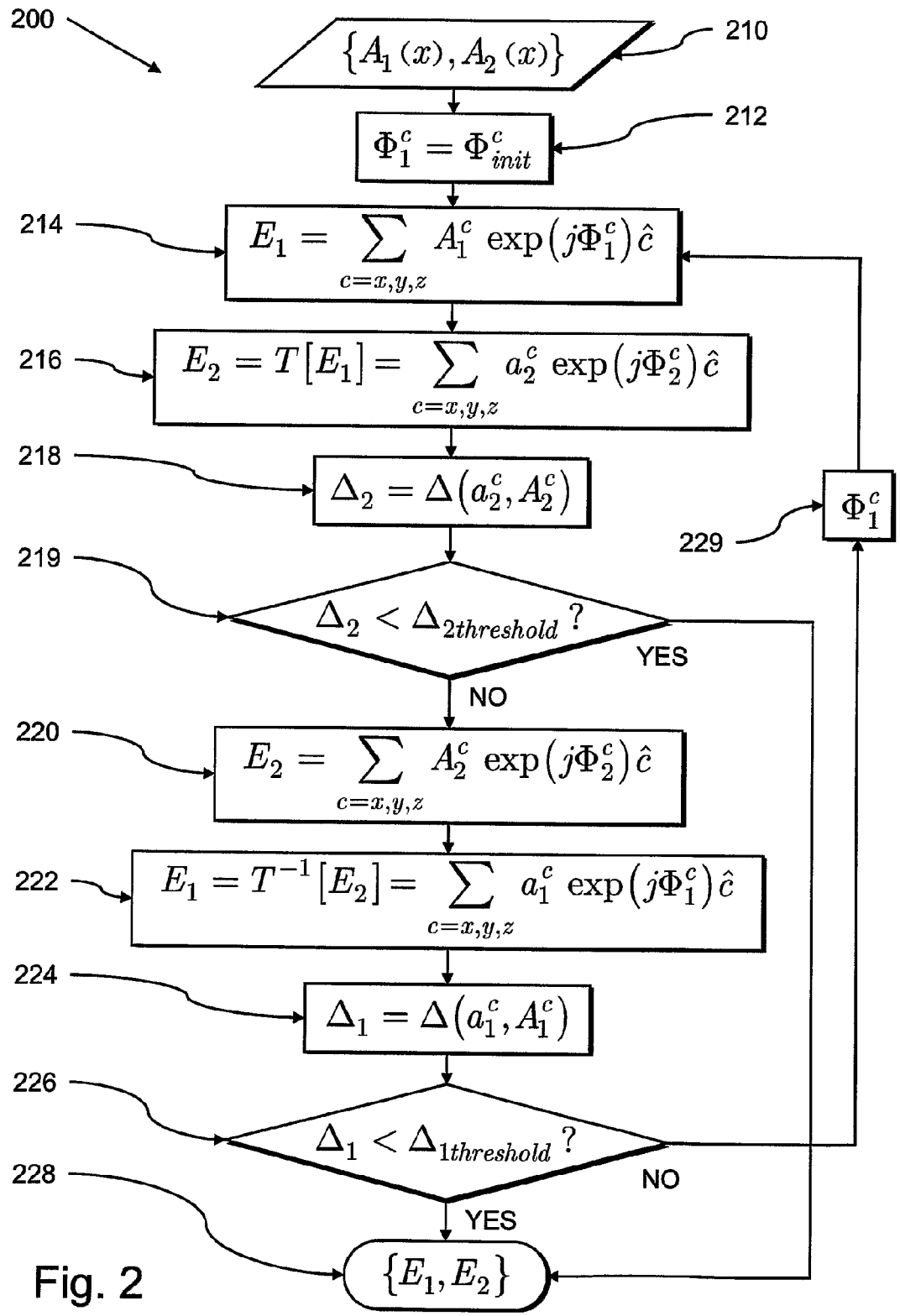
FIG. 2 shows a flow chart for use in the invention.

The mechanism by which the complex electric is determined in the measurement points in the first 150 and second 160 surfaces using the measured amplitudes will now be described in more detail with reference to the flow chart of FIG. 2.

However, before the flow chart 200 is commented upon here, it will be pointed out that the propagation of the complex electric field between the first and second measurement surfaces can be descried by means of a transfer function T, and the propagation in the other direction can thus be described using the inverse of said transfer function, referred to in the following as $T^{-1}$.

The transfer function as such is well known to those in the field, and accordingly, if the complex electric field at one of the first and second surfaces is known, the complex electric field at the other surface will also be known.

The algorithm 200 of FIG. 2 can briefly be described as follows: the measured amplitudes at one of the surfaces, for example the first surface, are used, and the phase at said points is assumed to be a certain value, for example zero.

The complex electric field with those values, i.e. the measured amplitude and the assumed phase, is passed through the transfer function T, which describes the propagation from the first surface to the second surface. The amplitudes which are arrived at then are compared to the measured amplitudes at the second surface, and if the discrepancy is below a certain threshold, the assumed phase value at the first surface is considered correct, and thus, the complex field at the first surface is described in full, since both the amplitude and the phase are now known.

The complex electric field at the second surface is also assumed to be known, since the discrepancy between the calculated amplitudes and the measured amplitudes at the points in the second surface is sufficiently small.

The phase values at the points in the second surface are also assumed to be correct, since the discrepancy between the calculated amplitudes and the measured amplitudes at the points in the second surface is sufficiently small, i.e. below a predefined threshold.

Since the complex electric field is now known at both the first and the second surfaces, the transfer function T can be used in order to calculate the complex electric field over the entire volume of interest in the body 120, and the SAR values can be calculated.

Returning now to the flowchart 200 of FIG. 2, the method of the invention will be described in more detail.

As a first step, denoted as step 210, the measured amplitudes at the points in the first 150 and second 160 surfaces in the body 120 are compiled for use.

Then, a phase value distribution is assumed for the first surface 150, which assumed phase value distribution is used in the next step of the flow chart.

The assumed phase value distribution can consist of more or less arbitrarily chosen values, since it is only the starting point for an iterative method, but a value of zero is used in a preferred embodiment of the invention. The phase distribution value in the first surface is denoted as $\phi_1^c$, in order to show that the phase value in each point of the surface comprises three components, one in each direction x, y, z, of the coordinate system show in FIG. 1. The superscript "c" is thus intended to show that $\phi_1$ comprises three orthogonal vector components, here referred to as (x, y, z).

Step 214 shows that the complex electric field $E_1$ in the first surface is assumed to consist of the measured amplitude $A_1$ and the assumed phase $\phi_1$. Again, in order to show that both the amplitude $A_1$ and the phase $\phi_1$ in each measurement point comprises three values, one in each direction x, y, z, of the coordinate system of FIG. 1, the field $E_1$ is here expressed as a sum over x, y, z, of $A_1$ and $\phi_1$: $E_1 = \Sigma A_1^c \exp(j\phi_1^c)\hat{c}$, with the superscript c ranging over x, y, z. The meaning of the superscript "c" is now assumed to be familiar to the reader, and will thus not be explained again in this text.

The complex electric field $E_1$ which is thus assumed is then, as indicated in block 216, subjected to the transfer function T, which is the transfer function that describes the field propagation from the first surface 150 to the second surface 160. Such transfer functions are well known to those skilled in the field, and will thus not be explained in further detail here.

Thus, in this way, an assumed (calculated) field $E_2$ at the second surface 160 is arrived at.

A check is then performed of the assumed field at the second surface 160. This test, as shown in block 218, consists of comparing the measured amplitude $A_2$ at the points in the second surface 160 with the assumed amplitude $a_2$ in the second surface.

If the discrepancy $\Delta_2$ between the measured and the assumed amplitude in the second surface 160 is smaller than a predetermined threshold, the procedure is interrupted, as shown in block 219, since the field at the second surface 160 is deemed to be correct, and consequently, the field at the first surface 150 is also deemed to be correct, since the assumed phase at the first surface 150 together with the measured amplitudes at the first field resulted in correct amplitudes at the second field.

The procedure which is followed if the electric field at the two surfaces is deemed to be known will be outlined further down in this description.

If the discrepancy $\Delta_2$ between the measured and the assumed amplitude in the second surface 160 exceeds the predetermined threshold, the assumed field in the first surface as well as the calculated field in the second surface are deemed to be incorrect, and the procedure continues in the following manner: as shown in block 220, the field $E_2$ in the second surface 160 is now assumed to comprise the measured field amplitude $A_2$ together with the calculated or assumed phase values $\phi_2$.

The assumed field in the second surface is then subjected to $T^{-1}$, i.e. the inverse function of the transformation function T. Thus, $T^{-1}$ is the function which can describe the field propagation from the second surface to the first surface, and accordingly, if the field at the second surface has been correctly assumed, the transformation $T^{-1}$ will result in a correct picture of the field at the first surface.

The transformation by means of $T^{-1}$ can be described in mathematical terms as: $E_1=T^{-1}[E_2]$, which is also shown in step 222 of the flow chart 200 in FIG. 2.

The field $E_1$ which is thus arrived at should present a correct picture of the filed at the first surface 150 if everything is correct. In order to check the correctness of the calculated field $E_1$ against the real field at the first surface, the amplitude $a_1$ of the calculated field is checked against the measured amplitude $A_1$ at the first surface 150.

If the discrepancy between the calculated field $a_1$ and the measured field $A_1$ is below a certain predetermined threshold $\Delta_1$, the calculated field at the first surface is deemed to be sufficiently true. Accordingly, the field which was used to generate or calculate the accepted field at the first surface is also deemed to be sufficiently true, i.e. the field at the second surface, as arrived at in step 220 is accepted as the field at that surface, and the procedure for generating the complex electric fields at the first 150 and second 160 surfaces is stopped, as shown in block 226 of the flow chart 200, since it is deemed that sufficiently good pictures of the fields $E_1$ and $E_2$ have been obtained, as indicated in block 228.

If the discrepancy between the calculated field $a_1$ and the measured field $A_1$ is not below said certain predetermined threshold, the procedure starts over again at block 214 as described above, until one of the two fields meets the criteria described above with reference to blocks 218 and 224 in the flow chart 200 in FIG. 2. The value of $\phi_1{}^c$ which is used is that which was arrived at in the calculation of block 222.

Suitable values for accepting the calculated amplitudes $a_1$, $a_2$, when compared to the measured amplitudes $A_1$, $A_2$, have proven to be discrepancies of 1% or less.

Since the electric field in at least two surfaces 150, 160, of the body 120 has been determined by means of the procedure described above, the transformation function T can now be used in order to determine the complex electric field in the entire body 120, or over an entire volume of interest in that body.

The complex electric field over the entire volume of interest in the body can then be used in order to arrive at the SAR value for the device 120. This is suitably done by means of the T function used previously.

The invention is not limited to the examples of embodiments which have been shown above, but may be freely varied within the scope of the appended patent claims. For example, more than two surfaces may be used in the procedure describe din the flow chart 200, and other kinds of bodies than the human body may be simulated by means of appropriate phantoms or models.

Also, as has been pointed out above, the inventive method and apparatus may be applied to other devices than cellular telephones, the method may be used with more or less any kind of device with emissions that it is desired to measure the impact of. Examples of such devices are cordless telephones, cordless microphones, auxiliary broadcast devices and radio parts of various sizes intended for computers.

As has been pointed out, the measurements in the two surfaces are carried out in distinct points in the surfaces. With reference to the coordinate system of FIG. 1, suitable distances between the points in one and the same surface have proven to be in the area of $\lambda/2$ or less, with $\lambda$ being the wavelength of the measured field in the liquid used. Suitable values for the distance between the two surfaces have proven to be in the area of $\lambda/8$ to $\lambda/4$.

The invention claimed is:

1. A method for calculating the Specific Absorption Rate (SAR) caused in a body by the electric field emitted by a wireless communications device, the method comprising the steps of:
   using a model of the body in which the SAR value is to be calculated;
   placing the device in question in proximity to said model;
   measuring the electric field components at specific points in said model;
   carrying out said measurements of the electric field components at points of a first and a second surface in said model;
   letting said measurements comprise measuring a magnitude of the electric field components at said points;
   using the measured magnitudes in order to determine a phase of the electric field components at said points, such that a complex electric field at said points is determined;
   using the complex electric field in said points in order to determine the complex electric field over an entire volume of interest in said model;
   determining the complex field in a first of said surfaces by using the measured field magnitude in the first surface, and an assumed phase value for the first surface, so that a complex field in the first surface is assumed, and the assumed complex field in the first surface is used in order to calculate a complex field $E_2$ for the second surface; and,
   using the complex electric field over said entire volume in order to calculate the SAR value caused by said device over said volume.

2. The method of claim 1, according to which said first and second surfaces are straight.

3. The method of claim 1, according to which said first and second surfaces are curved.

4. The method of claim 1, according to which the surfaces are parallel to one another.

5. The method of claim 1, according to which the surfaces are non-parallel with regard to one another.

6. The method of claim 1, according to which the complex electric field magnitude in said points is measured for each of the components $E_x$, $E_y$, $E_z$ in the field, and the phase in each of said components is consequently determined.

7. A device for calculating the Specific Absorption Rate (SAR) caused in a body by the electric field emitted by a wireless communications transmitter, the device comprising:
   a model of the body in which the SAR value is to be calculated;

means for holding the device in question in proximity to said model;

means for measuring the electric field components at specific points in said model;

means for carrying out said measurements of the electric field at points of a first and a second surface in said model;

means for letting said measurements comprise measuring a magnitude of the electric field components at said points;

means for using the measured magnitudes in order to determine a phase of the electric field components at said points, such that a complex electric field at said points is determined;

means for using the complex electric field in said points in order to determine the complex electric field over an entire volume of interest in said model; and, means for using the complex electric field over said entire volume in order to calculate the SAR value caused by said device over said volume, wherein in such device the complex electric field in a first of said surfaces is determined by means of the measured field magnitude in the first surface, and an assumed phase value for the first surface, so that a complex field in the first surface is assumed, and the assumed complex field in the first surface is used in order to calculate a complex field for the second surface.

8. The device of claim 7, in which said first and second surfaces are planar.

9. The device of claim 8, in which said first and second surfaces are curved.

10. The device of claim 7, in which the surfaces are parallel to one another.

11. The device of claim 7, in which the surfaces are non-parallel with regard to one another.

12. The device of claim 7, in which the electric field magnitude in said points is measured for each of the components $E_x$, $E_y$, $E_z$ in the field, the device comprising means for consequently determining the phase in each of said components.

* * * * *

UNITED STATES PATENT AND TRADEMARK OFFICE
CERTIFICATE OF CORRECTION

| | | |
|---|---|---|
| PATENT NO. | : 8,135,549 B2 | Page 1 of 1 |
| APPLICATION NO. | : 12/447289 | |
| DATED | : March 13, 2012 | |
| INVENTOR(S) | : Friden et al. | |

It is certified that error appears in the above-identified patent and that said Letters Patent is hereby corrected as shown below:

In Column 3, Line 50, delete "descried" and insert -- described --, therefor.

In Column 5, Line 27, delete "filed" and insert -- field --, therefor.

In Columns 5 & 6, Lines 67 & 1, delete "describe din" and insert -- described in --, therefor.

Signed and Sealed this
Tenth Day of July, 2012

David J. Kappos
*Director of the United States Patent and Trademark Office*